United States Patent
Zhu et al.

(10) Patent No.: US 9,203,391 B2
(45) Date of Patent: Dec. 1, 2015

(54) PULSE-WIDTH MODULATION DATA DECODER

(71) Applicant: QUALCOMM Incorporated, San Diego, CA (US)

(72) Inventors: Zhi Zhu, San Diego, CA (US); Xiaohua Kong, San Diego, CA (US); Li Sun, San Diego, CA (US); Jie Xu, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/258,980

(22) Filed: Apr. 22, 2014

(65) Prior Publication Data

US 2015/0303910 A1    Oct. 22, 2015

(51) Int. Cl.
*H04L 7/00* (2006.01)
*H03K 9/08* (2006.01)

(52) U.S. Cl.
CPC .................................. *H03K 9/08* (2013.01)

(58) Field of Classification Search
USPC .......................................... 329/312; 375/359
See application file for complete search history.

(56) References Cited

U.S. PATENT DOCUMENTS

| | | | |
|---|---|---|---|
| 4,216,426 A * | 8/1980 | Flora | 375/292 |
| 5,428,321 A | 6/1995 | Yoshida et al. | |
| 5,438,303 A | 8/1995 | Murakami et al. | |
| 5,696,800 A | 12/1997 | Berger | |
| 7,142,617 B2 | 11/2006 | Mohan | |
| 8,643,412 B2 | 2/2014 | Watanabe | |
| 2010/0260283 A1 | 10/2010 | Den | |
| 2011/0235459 A1* | 9/2011 | Ware et al. | 365/233.11 |
| 2013/0120036 A1* | 5/2013 | Zhu et al. | 327/156 |

FOREIGN PATENT DOCUMENTS

WO    2013048395 A1    4/2013

OTHER PUBLICATIONS

International Search Report and Written Opinion—PCT/US2015/020027—ISA/EPO—Jun. 10, 2015.

* cited by examiner

*Primary Examiner* — Joseph Chang
(74) *Attorney, Agent, or Firm* — Procopio, Cory, Hargreaves & Savitch LLP

(57) ABSTRACT

Systems and methods for decoding pulse-width modulated (PWM) data are disclosed. An example decoder filters a data input signal with a one-sided pulse filter. The one-sided pulse filter suppresses short pulses on the data input signal and passes long pulses. The example decoder latch the filtered data signal at the end of each bit time of the data input signal. The duration of pulses that are suppressed by the one-sided pulse filter can be calibrated to compensate for circuit variations and to allow the decoder to operate at various data rates. The decoder can be implemented in a small integrated circuit area and can be power efficient.

27 Claims, 2 Drawing Sheets

PULSE-WIDTH MODULATION DATA DECODER

BACKGROUND

1. Field

The present invention relates to electronic circuits and, more particularly, to a circuit for decoding pulse-width modulated data.

2. Background

The Mobile Industry Processor Interface (MIPI) Alliance has established a standard for a serial interface physical layer (PHY) named M-PHY. M-PHY may be used, for example, for communications between circuits in a mobile phone. An example use of M-PHY is for a Universal Flash Storage (UFS) link between a processor and a memory.

M-PHY communicates using pulse-width modulation (PWM) where the clock is embedded in a data signal. The data signal contains a serial stream of bits. Each bit of the serial stream spans a time interval that may be referred to as a bit time.

FIG. 1 is a waveform diagram of pulse-width modulated data. FIG. 1 illustrates the waveforms used with M-PHY, but other waveforms may be used with different polarities and different bit definitions. At the beginning and end of each bit time, the data signal transitions from high to low. A ZERO data value is represented by a pulse with a low time that is wider than the high time. A ONE data value is represented by a pulse with a high time that is wider than the low time. The width of the wide pulses may be, for example, two-thirds of the bit time.

Data rates in M-PHY are expressed as "gears." Each gear has a three-to-one range of supported data rates as shown in Table 1.

TABLE 1

| Gear | Minimum Data Rate | Maximum Data Rate |
| --- | --- | --- |
| 1 | 3 Mbps | 9 Mbps |
| 2 | 6 Mbps | 18 Mbps |
| 3 | 12 Mbps | 36 Mbps |
| 4 | 24 Mbps | 72 Mbps |
| 5 | 48 Mbps | 144 Mbps |
| 6 | 96 Mbps | 288 Mbps |
| 7 | 192 Mbps | 576 Mbps |

Communication on an M-PHY link can occur in bursts. The bursts include various states including a synchronization (SYNC) state that has a data sequence useful for synchronizing a receiver to a transmitter. The SYNC state may, for example, have a high density of transitions between data values. User data is communicated in a PAYLOAD state made up of 8B 10B (8 data bits coded as 10 pulse-width modulated bits) coded symbols.

Prior PWM decoders have used oversampling to recover the data. For example, a decoder may sample the data input 12 times per bit time and analyze the samples to determine the received data values. This type of decoder may not be suitable to use at the higher gears.

SUMMARY

In one aspect, a decoder is provided for decoding pulse-width modulated data from a data input signal, the data input signal containing a serial stream of bits, each bit of the serial stream spanning a bit time, each bit of the serial stream having a high pulse whose duration signals the value of the respective bit. The decoder includes a one-sided pulse filter configured to produce a filtered data signal by shortening the durations of high pulses on the data input signal; and a flip-flop configured to latch the filtered data signal at the end of each bit time of the data input signal.

In one aspect, a method is provided for decoding pulse-width modulated data from a data input signal, the data input signal containing a serial stream of bits, each bit of the serial stream spanning a bit time, each bit of the serial stream having a trailing pulse whose duration signals the value of the respective bit. The method includes filtering the data input signal to shorten the trailing pulses; and latching the filtered data input signal on trailing edges of the data input signal.

In one aspect, an apparatus is provided for decoding pulse-width modulated data from a data input signal, the data input signal containing a serial stream of bits, each bit of the serial stream spanning a bit time, each bit of the serial stream having a trailing pulse whose duration signals the value of the respective bit. The apparatus includes a means for filtering the data input signal to shorten trailing pulses; and a means for latching the filtered data input signal on trailing edges of the data input signal.

Other features and advantages of the present invention should be apparent from the following description which illustrates, by way of example, aspects of the invention.

BRIEF DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION

The detailed description set forth below, in connection with the accompanying drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in simplified form in order to avoid obscuring such concepts.

Figure 2:
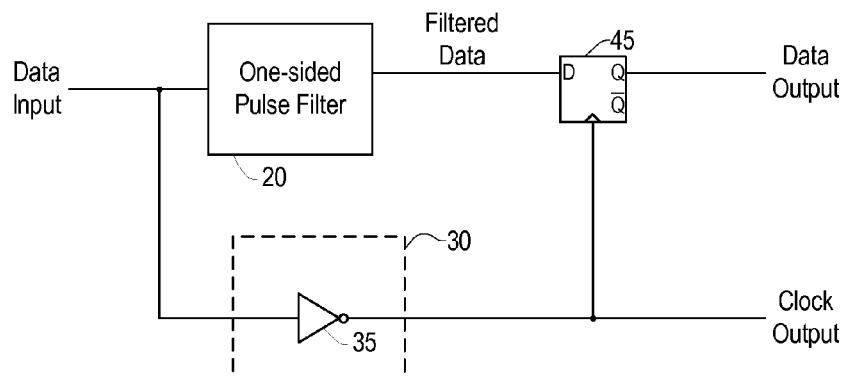
FIG. 2 is a functional block diagram of a PWM decoder according to a presently disclosed embodiment.

FIG. 2 is a functional block diagram of a PWM decoder according to a presently disclosed embodiment. The PWM decoder can be implemented in many different ways. In an embodiment, the PWM decoder is implemented in a complementary metal oxide semiconductor (CMOS) integrated circuit.

Figure 1:
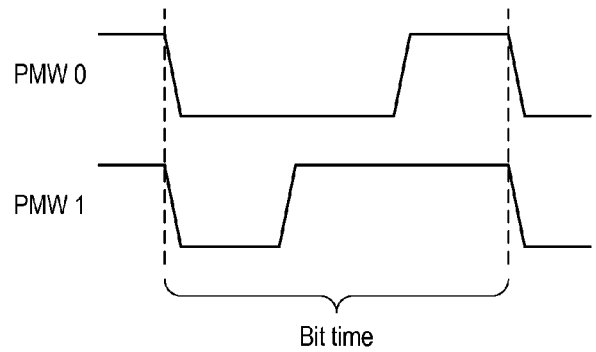
FIG. 1 is a waveform diagram of pulse-width modulated (PWM) data.

The decoder receives a serial stream of data on a data input signal (Data Input). The data input signal is pulse-width modulated, for example, using waveforms as illustrated in FIG. 1. The decoder decodes the data in the data input signal to produce a data output signal (Data Output) that signals the values of the PWM-coded data in the data input signal. The PWM decoder can also supply a clock output signal (Clock Output) that signals the timing of the data output signal.

The decoder includes a one-sided pulse filter 20 that receives the data input signal and produces a filtered data signal (Filtered Data). The one-sided pulse filter 20 shortens (or chops) the high time of pulses that it receives. The amount of pulse shortening by the one-sided pulse filter 20 is set so that the high pulse of a PWM data ZERO bit is completely suppressed and the filtered data signal remains low during the bit time of a data ZERO and that the active pulse of a PWM data ONE bit is not completely suppressed and the filtered data signal transitions high during the bit time of a data ONE.

The one-sided pulse filter 20 may be viewed as a buffer that has different input-to-output delays for rising transitions and falling transitions. Accordingly, the one-sided pulse filter 20 may be referred to as an asymmetric filter. The delay for rising transitions is greater than the delay for falling transitions so that the duration of high pulses is shortened. The delay for falling transitions may be short, for example, a few gate delays.

Signal transitions may also be referred to as edges; for example, a rising transition may also be referred to as a rising edge and a falling transition may be referred to as a falling edge. Similarly, a rising transition may be referred to as a transition from a low level to a high level and a falling transition may be referred to as a transition from a high level to a low level.

The decoder may calibrate the delay for rising transitions before receiving user data. Calibrating the delay for rising transitions provides calibration of the durations of high pulses that are suppressed. For example, the delay may be calibrated during the synchronization state of a received M-PHY data signal. The calibration may, for example, include sweeping through a range of possible delay values. Some of the delay values, those with delays that are too long, will result in the data output signal being all ZEROs. Other delay values, those with delays that are too short, will result in the data output signal being all ONEs. The calibration may, for example, select a delay midway between the lowest delay value that is too high and the highest delay value that is too low. The calibration may also look for particular output values based on the expected pattern in the synchronization state. A calibration module can monitor the data output signal during the synchronization (SYNC) state. Based on the values of the data output signal, the calibration module may adjust delay settings such that the data output signal is no longer constant ZEROs or ONEs. The calibration module can also check for a data pattern that is 8B 10B encoded and has at least one transition every 3 bit times.

The filtered data signal from the one-sided pulse filter 20 is captured in a flip-flop 45. The flip-flop 45 has a data input (D) connected to the filtered data signal, a clock input connected to the clock output signal, and a data output (Q) connected to the data output signal of the decoder.

A clock generator module 30 supplies the clock output signal. In the embodiment illustrated in FIG. 2, the clock generator module 30 includes an inverter 35. The clock generator module 30 produces the clock output signal from the data input signal. The inverter 35 has an input connected to the data input signal and an output connected to the clock output signal. Thus, the clock output signal is the logical complement of the data input signal. In other embodiments, the clock generator module 30 may include other circuitry, for example, based on the characteristics of the flip-flop 45.

Since the data input signal falls at the end of each bit time, the clock output signal rises at the end of each bit time. The flip-flop 45 is rising-edge triggered and latches the filtered data signal on rising edges of the clock output signal, which occur at the end of each bit time. Thus, the data output signal is set to the value of the filtered data signal at the end of each bit time. The clock generator module 30 and the one-sided pulse filter 20 can be designed so that their delays satisfy timing requirements of the flip-flop 45. For example, the minimum delay from input-to-output of the one-sided pulse filter 20 for falling transitions should be long enough (relative to the delay of the clock generator module 30) to satisfy a hold time requirement of the flip-flop 45.

Figure 3:
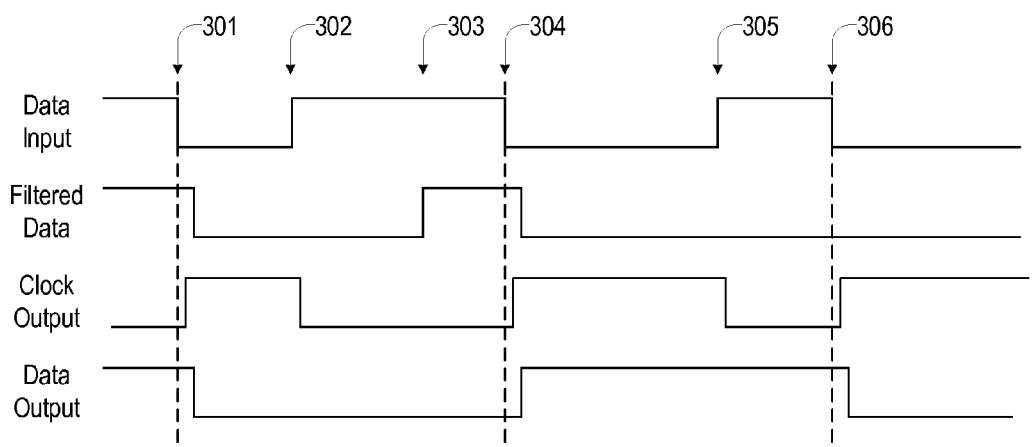
FIG. 3 is a waveform diagram illustrating operation of the PWM decoder of FIG. 2.

FIG. 3 is a waveform diagram illustrating operation of the PWM decoder of FIG. 2. FIG. 3 illustrates a data ONE bit time from time 301 to time 304 and a data ZERO bit time from time 304 to time 306. For clarity of illustration, the waveforms are illustrated for circuit delays that are small relative to a bit time and signal transitions that are instantaneous.

For the data ONE bit time, at time 301, the data input signal falls and shortly thereafter the filtered data signal also falls. The delay time from the falling of the data input signal to the falling of the filtered data signal is the delay of the one-sided pulse filter 20 for falling transitions. At time 302, the data input signal rises. At time 303, the filtered data signal rises. The delay from time 302 to time 303 is the delay of the one-sided pulse filter 20 for rising transitions. At time 304, the end of the data ONE bit time, the data input signal falls and the clock output signal rises. The rising edge of the clock output signal triggers the flip-flop 45 to latch the filtered data signal. Since the filtered data signal is high at this time, the data output is set to a ONE, which matches the PWM coded value of the data input signal.

For the data ZERO bit time, at time 304, the data input signal falls and shortly thereafter the filtered data signal falls as at time 301. At time 305, the data input signal rises. At time 306, the end of the data ZERO bit time, the data input signal falls and the clock output signal rises. The active time of the data input signal from time 305 to time 306, is shorter than the delay of the one-sided pulse filter 20 for rising transitions. Thus, the filtered data signal remains low. The rising edge of the clock output signal triggers the flip-flop 45 to latch the filtered data signal. Since the filter data signal is low at this time, the data output is set to a ZERO, which matches the PWM coded value of the data input signal.

Figure 4:
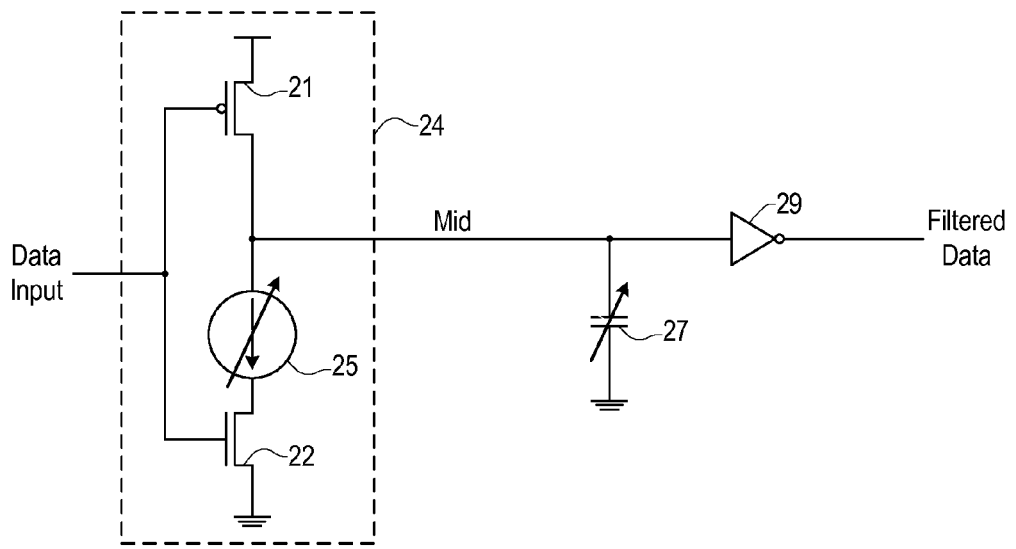
FIG. 4 is a schematic diagram of a one-sided pulse filter according to a presently disclosed embodiment.

FIG. 4 is a schematic diagram of a one-sided pulse filter according to a presently disclosed embodiment. The one-sided pulse filter may be used as the one-sided pulse filter 20 in the decoder of FIG. 2.

The one-sided pulse filter of FIG. 4 receives the data input signal and produces the filtered data signal with shortened high times of pulses. The one-sided pulse filter uses a current discharging a capacitor 27 to control the amount of pulse shortening. The current is from a current source 25 that switchably discharges the capacitor 27 based on the data input signal.

The one-sided pulse filter includes a first inverter 24 made up of a p-channel transistor 21, the current source 25, and an n-channel transistor 22. The output of the inverter is connected to a midpoint (Mid) of the one-sided pulse filter. A second inverter 29 has its input connected to the midpoint and its output connected to the filtered data signal. The p-channel transistor 21 has its gate connected to the data input signal, its source connected to a voltage supply, and its drain connected to the output of the first inverter 24. The n-channel transistor 22 has its gate connected to the data input signal and its source connected to a ground reference. The n-channel transistor 22 has its drain connected to a terminal of the current source 25 whose other terminal is connected to the output of the first inverter 24. Thus, the channel of the n-channel transistor 22 is in series with the current source 25. Alternatively, the current source 25 may be connected to the ground reference and the drain of the n-channel transistor 22 connected to the midpoint of the one-sided pulse filter. The current source 25 discharges the capacitor 27 when the data input signal is high.

The amount of shortening of pulses (the delay for rising transitions) is controlled by the current of the current source 25 and the capacitance of the capacitor 27. The delay for rising transitions is based on the product of the current of the current source 25 and the capacitance of the capacitor 27. One or both of the current source 25 and the capacitor 27 are variable so that the amount of pulse shortening can be adjusted for calibration and for different gears. The calibration may include adjusting a digital value. For example, the current source 25 may include a current-mode digital-to-analog converter. Alternatively or additionally, the capacitor 27 may include, for example, multiple capacitors that are switchably connected to the midpoint of the one-sided pulse filter.

The range of delay adjustment can be chosen based on the range of data rates that the PWM decoder will be used with. For example, if the PWM decoder will be used in gear 6 of M-PHY, the range of delay adjustments may be greater than a factor of 3. The range of data rates for gear 6 spans a factor of 3. The adjustment range of the one-sided pulse filter may be greater than a factor of 3, for example, to include variations in process, voltage, and temperature. For another example, if the PWM decoder will be used in gears 6 and 7 of M-PHY, the range of the day delay adjustments may be greater than a factor of 6 (which is the ratio of the minimum data rate in gear 6 to the maximum data rate in gear 7).

Figure 5:
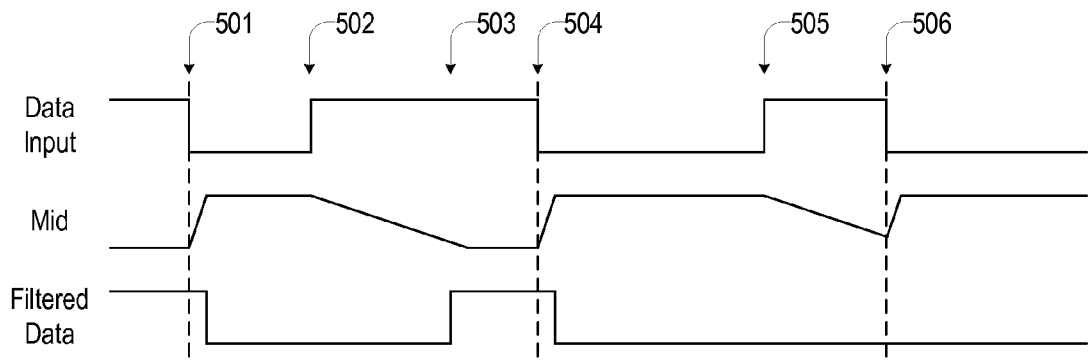
FIG. 5 is a waveform diagram illustrating operation of the one-sided pulse filter of FIG. 4.

FIG. 5 is a waveform diagram illustrating operation of the one-sided pulse filter of FIG. 4. FIG. 5 illustrates a data ONE bit time from time 501 to time 504 and a data ZERO bit time from time 504 to time 506.

For the data ONE bit time, at time 501, the data input signal falls. This turns on p-channel transistor 21 and pulls the midpoint high. The high-level on the midpoint causes the second inverter 29 to switch and drive the filtered data signal low. The delay time from the falling of the data input signal to the falling of the filtered data signal is the delay of the one-sided pulse filter for falling transitions. This delay will be short when the p-channel transistor 21 is able to rapidly charge the capacitor 27.

At time 502, the data input signal rises. This turns off p-channel transistor 21 and turns on n-channel transistor 22 which enables the current source 25 to discharge the capacitor 27. The voltage on the midpoint will ramp downward at a rate determined by the current source 25 and the capacitor 27. At time 503, the midpoint has ramped to a level that causes the second inverter 29 to switch. Accordingly, at time 503 the filtered data signal switches high. The delay from time 502 to time 503 is the delay of the one-sided pulse filter for rising transitions. The filtered data signal remains high through the end of the data ONE bit time.

For the data ZERO bit time, at time 504, the data input signal falls. As described for time 501, this causes the filtered data signal to fall. At time 505, the data input signal rises. This turns off p-channel transistor 21 and turns on n-channel transistor 22, which enables the current source 25 to discharge the capacitor 27. The voltage on the midpoint will ramp downward at a rate determined by the current source 25 and the capacitor 27. At time 506, the data input signal falls. At this time, the midpoint has not ramped downward enough to cause the second inverter 29 to switch. Accordingly, at time 503 the filtered data signal remains low through the end of the data ZERO bit time.

The systems and methods above have been described for the signal definitions used in an M-PHY communication link. In other communication links, other signal polarities and bit value definitions may be used. In general, the transition (falling in FIG. 1) at the beginning of the bit time may be referred to as a leading edge, and the transition (falling in FIG. 1) at the end of the bit time may be referred to as a trailing edge. Similarly, the pulse (low in FIG. 1) at the beginning of the bit time may at be referred to as a leading pulse, and the pulse (high in FIG. 1) at the end of the bit time may be referred to as a trailing pulse. Additionally, the pulses within a bit time may be referenced by their duration for example using terms such as narrow, wide, short, or long.

Variations in the decoder of FIG. 2 can work with other signal polarity and bit-value definitions. For example, the one-sided pulse filter 20 can be configured to shorten (or chop) the duration of the trailing pulses that it receives. The one-sided pulse filter 20 suppresses short trailing pulses and passes (albeit with a shorter duration) long trailing pulses. Similarly, the flip-flop 45 can be configured to latch the filtered data signal on the trailing edges of the data input signal.

Figure 6:
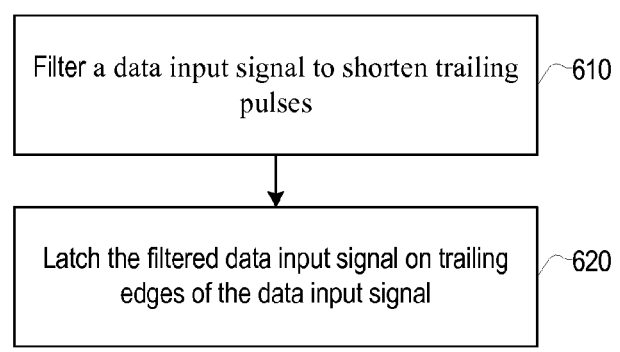
FIG. 6 is a flowchart of a process for decoding pulse-width modulated data according to a presently disclosed embodiment.

FIG. 6 is a flowchart of a process for decoding pulse-width modulated data according to a presently disclosed embodiment. The process may be implemented, for example, using the PWM decoder of FIG. 2.

In step 610, the process filtering the data input signal to shorten trailing pulses. The filtering suppresses short trailing pulses on the data input signal but does not suppress long trailing pulses on the data input signal. The durations of pulses that suppress may be determined by calibration. For example, the one-sided pulse filter 20 of the decoder of FIG. 2 may be used to filter the data input signal.

In step 620, the process latches the filtered data input signal (from step 610) on trailing edges of the data input signal. For example, the flip-flop 45 of the decoder of FIG. 2 may latch the output of the one-sided pulse filter 20 on falling edges of the data input signal. The process may also include generating a clock output signal from the data input signal and using the clock output signal to trigger latching the filtered data input signal.

The process of FIG. 6 may be modified, for example, by adding or altering steps. Additionally, steps may be performed concurrently.

Although particular embodiments are described above, many variations are possible, including, for example, those with different signal polarities and data bit definitions. Furthermore, functions described as be performed by one module may be moved to another module or distributed across modules. Additionally, features of the various embodiments may be combined in combinations that differ from those described above.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent presently preferred embodiments of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A decoder for decoding pulse-width modulated data from a data input signal, the data input signal containing a serial stream of bits, each bit of the serial stream spanning a bit time, each bit of the serial stream having a high pulse whose duration signals the value of the respective bit, the decoder comprising:
   a one-sided pulse filter configured to produce a filtered data signal by shortening the durations of high pulses on the data input signal; and
   a flip-flop configured to latch the filtered data signal at the end of each bit time of the data input signal.

2. The decoder of claim 1, wherein the one-sided pulse filter is configured to suppress short high pulses on the data input signal.

3. The decoder of claim 2, wherein the one-sided pulse filter is configured to not suppress long high pulses on the data input signal.

4. The decoder of claim 1, wherein the one-sided pulse filter has an input-to-output delay for rising transitions that is greater than an input-to-output delay for falling transitions.

5. The decoder of claim 4, wherein the input-to-output delay for rising transitions of the one-sided pulse filter is calibrated.

6. The decoder of claim 5, wherein the calibration includes a range of delays greater than a factor of three.

7. The decoder of claim 5, wherein the input-to-output delay for rising transitions of the one-sided pulse filter is calibrated during a synchronization state of the data input signal.

8. The decoder of claim 5, wherein the calibration is digitally controlled.

9. The decoder of claim 1, wherein the one-sided pulse filter includes:
   a capacitor; and
   a current source configured to discharge the capacitor based on the data input signal,
   wherein an input-to-output delay of the one-sided pulse filter for rising transitions is based on the product of the capacitance of the capacitor and the current of the current source.

10. The decoder of claim 9, wherein the current source includes a current-mode digital-to-analog converter.

11. The decoder of claim 1, further comprising a clock generator module configured to receive the data input signal and produce a clock output signal for triggering the flip-flop configured to latch the filtered data signal.

12. The decoder of claim 11, further wherein the clock generator module includes an inverter having an input coupled to the data input signal and an output coupled to the clock output signal, and wherein the flip-flop latches the filtered data signal on rising edges of the clock output signal.

13. A method for decoding pulse-width modulated data from a data input signal, the data input signal containing a serial stream of bits, each bit of the serial stream spanning a bit time, each bit of the serial stream having a trailing pulse whose duration signals the value of the respective bit, the method comprising:
   filtering the data input signal to shorten the trailing pulses; and
   latching the filtered data input signal on trailing edges of the data input signal.

14. The method of claim 13, wherein filtering the data input signal includes suppressing short trailing pulses on the data input signal.

15. The method of claim 14, wherein filtering the data input signal includes not suppressing long high trailing on the data input signal.

16. The method of claim 14, further comprising calibrating the durations of trailing pulses that are suppressed.

17. The method of claim 16, wherein the calibration is performed during a synchronization state of the data input signal.

18. The method of claim 16, wherein the calibration is digitally controlled.

19. The method of claim 13, further comprising generating a clock output signal based on the data input signal for use in latching the filtered data input signal.

20. A apparatus for decoding pulse-width modulated data from a data input signal, the data input signal containing a serial stream of bits, each bit of the serial stream spanning a bit time, each bit of the serial stream having a trailing pulse whose duration signals the value of the respective bit, the apparatus comprising:
   a means for filtering the data input signal to shorten trailing pulses; and
   a means for latching the filtered data input signal on trailing edges of the data input signal.

21. The apparatus of claim 20, wherein the means for filtering the data input signal suppresses short trailing pulses on the data input signal.

22. The apparatus of claim 21, wherein the means for filtering the data input signal does not suppress long trailing pulses on the data input signal.

23. The apparatus of claim 21, wherein the durations of trailing pulses that are suppressed is calibrated.

24. The apparatus of claim 23, wherein the calibration includes a range of delays greater than a factor of three.

25. The apparatus of claim 23, wherein the calibration is digitally controlled.

26. The apparatus of claim 20, further comprising a clock generator module configured to receive the data input signal and produce a clock output signal for triggering the means for latching to latch the filtered data signal.

27. The apparatus of claim 26, further wherein the clock generator module comprises an inverter having an input coupled to the data input signal and an output coupled to the clock output signal, and wherein the means for latching latches the filtered data signal on trailing edges of the clock output signal.

* * * * *